(12) United States Patent
Derflinger et al.

(10) Patent No.: US 6,241,431 B1
(45) Date of Patent: Jun. 5, 2001

(54) PROCESS FOR THE PROTECTIVE COATING OF MACHINING TOOLS AND TOOL SETS

(75) Inventors: Volker Derflinger, Feldkirch; Harald Zimmermann, Feldkirch-Levis; Christian Wohlrab, Feldkirch, all of (AT)

(73) Assignee: Unaxis Balzers Aktiengesellschaft, Liechtenstein (AT)

(*) Notice: Subject to any disclaimer, the term of this patent is extended or adjusted under 35 U.S.C. 154(b) by 0 days.

(21) Appl. No.: 09/253,212

(22) Filed: Feb. 19, 1999

(30) Foreign Application Priority Data

Feb. 17, 1999 (EP) .................................. 99103093

(51) Int. Cl.⁷ .................................................. B23B 27/14
(52) U.S. Cl. .............................. 407/119; 407/118; 407/32
(58) Field of Search .................... 407/118, 119, 407/32; 408/144, 145; 51/309; 428/698, 697, 457

(56) References Cited

U.S. PATENT DOCUMENTS 5,075,181 * 12/1991 Quinto et al. .................. 407/119 X
5,272,014   12/1993 Leyendecker et al. .
5,318,840    6/1994 Ikeda et al. .
5,722,803 *  3/1998 Battaglia et al. ................... 407/119
5,882,777 *  3/1999 Kukino et al. ................ 407/119 X

FOREIGN PATENT DOCUMENTS 1951712    11/1995 (DE) .
1952638     2/1996 (DE) .
405069205 *  3/1993 (JP) ................................ 407/119
405337703 * 12/1993 (JP) ................................ 407/119
406015505 *  1/1994 (JP) ................................ 407/119

OTHER PUBLICATIONS

EP 99 10 3093, European Search Report.

* cited by examiner

*Primary Examiner*—Henry Tsai
(74) *Attorney, Agent, or Firm*—Notaro & Michalos P.C.

(57) ABSTRACT

A set of machining tools containing at least two separate tools is provided, one of which is tailored for a certain type of application and the other tailored for another application or use. The first tool is particularly adapted for applications having service requirements where the coating on the basic body of the tool must have high adhesive strength, but need not have high hardness, and the second tool is for service requirements of high hardness for the hard material coating, where the adhesive strength is not important.

9 Claims, 3 Drawing Sheets

PROCESS FOR THE PROTECTIVE COATING OF MACHINING TOOLS AND TOOL SETS

FIELD AND BACKGROUND OF THE INVENTION

In the present specification by hard material is understood a compound, namely a carbide, oxide, oxycarbide, but in particular a nitride, nitrocarbide, oxynitride or nitrooxycarbide, of at least two of the metallic elements listed in the following, in particular of Ti and Al. By metallic elements are understood Ti, Zr, Hf, V, Nb, Ta, Cr, Mo, W and Al.

If within the scope of the present application reference is made to a change of the composition of the hard material layer material in the active edge region, by that is understood a difference of at least 2 at % of a hard material layer metal component between a hard material layer in the active edge region and a hard material layer in the remaining regions of the tool.

Analogously, no change exists if the stated difference is less than 2 at %, in particular less than 1 at %.

By machining cross section f $a_p$ is understood the product "Vorschub x Schnitttiefe" {Advance x cutting depth} according to DIN 6580, Section 11.1.1, "Bewegungen und Geometrie des Zerspanungsvorgang" [Motions and Geometry of the Machining Process] (DN 6580, October 1985).

DE 38 25 399 as well as EP 0 352 545 disclose coating tools by means of a vacuum process with a layer of hard material, and therein especially with a (Ti,Al)N hard material layer. The coating takes place such that in the active edge region, i.e. in the region of the cutting edges, the hard material layer material has a changed composition compared with that on the remaining tool regions: according to DE 38 25 399 as well as EP 0 352 545 at the active edge regions of drills a thinning out of the aluminum is realized which is distinguishable on the tools by the reddish or yellowish coloration of these regions. Thinning-out ratios of 5 at % or 2 percent by mass of the Al are declared.

SUMMARY OF THE INVENTION

The process discovered, namely to change the hard material layer composition in the active edge region, is fundamentally represented as a measure for attaining a significant improvement of the quality of the coating.

Building generally on tools in which the provided hard material layer in the active edge region has substantially, and within the scope of measurability, an unchanged material composition as well as on tools in which, in contrast to the first stated, the composition of the hard material layer in the active edge region is changed, each relative to the hard material layer composition on the remaining tool regions, it is the task of the present invention to propose a process for the protective coating of machining tools as well as a set of at least two tools, by means of which substantially improved specific working properties are attained. In particular, as a working property to be improved is understood the service life of the tool or the decrease of the tool wear.

According to the process of the invention, onto the basic tool body a hard material layer is applied in any case but, specific to the tool stress, the composition of the hard material layer in the active edge region is either left with minimum changes relative to the composition of the hard material layer in the remaining coating regions on the tool basic body or is intentionally changed. The former, i.e. constant composition, is realized if the primary requirements to be made of the tools relate to adhesive strength of the hard material layer and only secondarily to hardness of the hard material layer. The second, in contrast, is realized if the primary requirements to be made of the tools relate to hardness of the hard material layer and only secondarily to adhesive strength of the hard material layer.

According to the invention it was consequently found that the estimating, previously described effective specifications of changed or unchanged compositions of hard material layers in the active edge regions of machining tools are not permissible, that namely, as a function of the working purpose of the tools, one time a hard material coating of constant composition and another time a hard material coating of varying composition in the active edge region in practice, i.e. when applying the tool, only leads to critical improvements: If tools for given application conditions are coated with the wrong coating technologies one of the two mentioned, therewith often an impairment of its working properties, in particular tool life, is obtained.

It could be shown, for example, that according to EP 0 352 545 with a thinning-out of the coating only in a few application fields of machining working better or at least equally good results can be achieved, compared to the application of corresponding tools with a lower or no, at least not measurable, difference in the concentration of the hard material layer. It should be pointed out in particular that the example mentioned in EP 0 352 545 with respect to service life of twist drills, based on the representative comparisons made according to the present invention, is erroneous in the case two completely identical, except for stated coating difference, and identically coated drills are present. By completely identical is therein understood the application of the same coating processes, in particular arc or sputtering processes, on identical tool bodies, and the adjustment of the realized or nonrealized concentration difference takes place exclusively by adjusting the voltage applied on the basic tool body during the coating with respect to ground or reference potential, referred to as bias voltage $U_{bias}$ in the following, and/or of the reactive gas partial pressure $P_{reactiv}$ in the vacuum coating receptacle with further process parameters remaining unchanged.

That the prior known thinning-out in the active edge region can effect critical disadvantages in the use of the tool, and that consequently it is necessary to assess very carefully according to the invention which process is applied at which time, can be seen, for example, by the fact that precisely the aluminum depletion of the hard material layer in the active edge region has negative effects on the wear through thermal stress of the hard material layer since through the aluminum thinning-out potentially now less aluminum reaches the surface of the hard material layer through diffusion and no continuous thermally insulating aluminum oxide layer can be formed there. The $Al_2O_3$ layer on the surface is simultaneously worn out during the working process and formed again through Al diffusion. But precisely this phenomenon can critically influence the durability of a provided hard material layer with aluminum component under specific conditions of application.

According to the invention as explained in the following examples, it could be shown that tools with a hard material layer, in particular a (Ti,Al)N layer, comprising at least only a low or no longer measurable composition change of the material of the hard material layer in the active edge region, in many application cases yield a substantially better service life, even with increased cutting efficiency, than other tools, otherwise identical, with a composition change of the hard material layer in the active edge region. Especially good results can be achieved, in the case given first, if in the active edge region the change of one of the metal components of the hard material layer is less than 2 at %, preferably it is maximally 1 at % or no longer measurable.

Following another feature of the invention, when using arc vaporization for depositing the hard material layer, an as much as possible unchanged hard material layer composition in the active edge region is attained thereby that for the ratio $U_{BIAS}$—of the electric basic tool body voltage relative to reference potential, usually ground potential, —to the partial pressure of the reactive gas $p_{reactiv}$ the following range is maintained:

$$1\times10^{-3} \leq U_{BIAS}/p_{reactiv} \leq 4\times10^3,$$

with the unit of voltage being "volt" and the unit of pressure "mbar".

Furthermore the invention produces drills, roughing milling cutters, peripheral milling cutters and hobbing machines with as much as possible unchanged composition of the hard material layer in the active edge region, however front-end milling cutters and ball-end milling cutters with changed composition of the hard material layer in the active edge region.

It was in particular found that, the composition of the hard material layer in the active edge region of the tools should be realized as much as possible unchanged if these tools are intended for the working of relatively large voltage or machining cross sections and for low cutting rates; however, that tools should be prepared with a changed composition of the hard material layer in the active edge region if the latter are intended for relatively low voltage or machining cross sections but relatively high cutting rates.

A further criterion for the selection according to the invention of the type of hard material coating in the active edge region of the tools results, thereby that for the working of materials with a hardness of at most 45 Rockwell (HRS) and a tensile strength up to at most 1500 N/mm², preferred for the working of heat-treatable steels, high-alloy and stainless steels as well as of nonferrous metals, to carry out the coating with hard material in the active edge region as much as possible without changing the composition. The same applies, to tools whose active edges in application are simultaneously subjected to different cutting rates, such as in particular to drills on which a minimum cutting rate occurs at the tip of the drill and a high rate on the drill periphery.

Basic tool bodies are coated in the active edge region with changed composition of the hard material layer, which are intended for the machining working of materials with a hardness of more than 45 Rockwell (HRC) and with a tensile strength of more than 1500 N/mm², in particular for operations involving the removal of hard metal by cutting tools, for example, instead of grinding or erosion processes.

It has in particular been found, that indexable inserts for turning tools and for materials AISI 304SS or DIN 1.4306 to be worked, indexable inserts for peripheral milling cutters for materials AISI 4140 or DIN 1.7225 to be worked, indexable inserts SEE 42TN for milling cutters for material SKD 61 (HRC 45) to be worked, hard metal roughing shank-type milling cutters for materials DIN 1.2344 to be worked in dry working, as well as HSS drills for materials AISI D3 or DIN 1.2080 as well as GG 25 to be worked with emulsion lubrication should be realized as much as possible with unchanged composition of the hard material layer in the active edge region; however hard metal roughing shank-type milling cutters for materials DIN 1.2311 to be worked with emulsion lubrication hard metal front-end milling cutters for materials AISI D2 or DIN 1.237 to be worked hard metal ball-end milling cutters J97 for dry working of DIN 1.2343, 49.5 HRC, preferably with changed composition of the hard material layer in the active edge region.

Further, at least two tools are therein provided, one for a first specific application operation in which primarily high adhesion strength of the hard material layer is required, however, only secondarily high hardness of the hard material layer, and a second tool, during the application of which primarily high hardness of the hard material layer is required and only secondarily high adhesion strength of this layer.

In this tool set according to the invention, the first tool is coated in the active edge region with substantially uniform composition of the hard material layer, however the second one with varying composition of the hard material layer.

Whether or not a tool is provided with a hard material coating whose composition in the active edge region is changed, is often evident by the coating coloration of the tool in the active edge region, thus typically for (Ti,Al)N layers with Al depletion in the active edge region through its yellowish or reddish coloration in stated region.

Through the present specification and the claims, the relevant expert gains clear instructions, based on which criteria he is to investigate, which active edge hard material coating techniques lead to better tool application behavior. Even when in specification and claims specific tool types as well as their type of application and the materials to be worked are specified, this is not to be understood to be conclusive for the expert but rather he recognizes, based on the evaluation of the useful coating type for further tools for further application fields and materials, considered by analogy, which coating technique is to be applied, or he obtains the advice first of all to try which of the two coating techniques leads to better results.

BRIEF DESCRIPTION OF THE DRAWINGS

In the following the invention will be explained with reference to examples and, in connection therewith, to Figures. Therein depict.

DESCRIPTION OF THE PREFERRED EMBODIMENTS

In the discussed examples, identical basic tool bodies were in each instance coated by means of arc vaporization. In examples 1 to 4 the coating conditions specified in the following by A and B were selected. The layer thickness, in particular in the active edge region, was approximately 3.5 μm.

Figure 1:
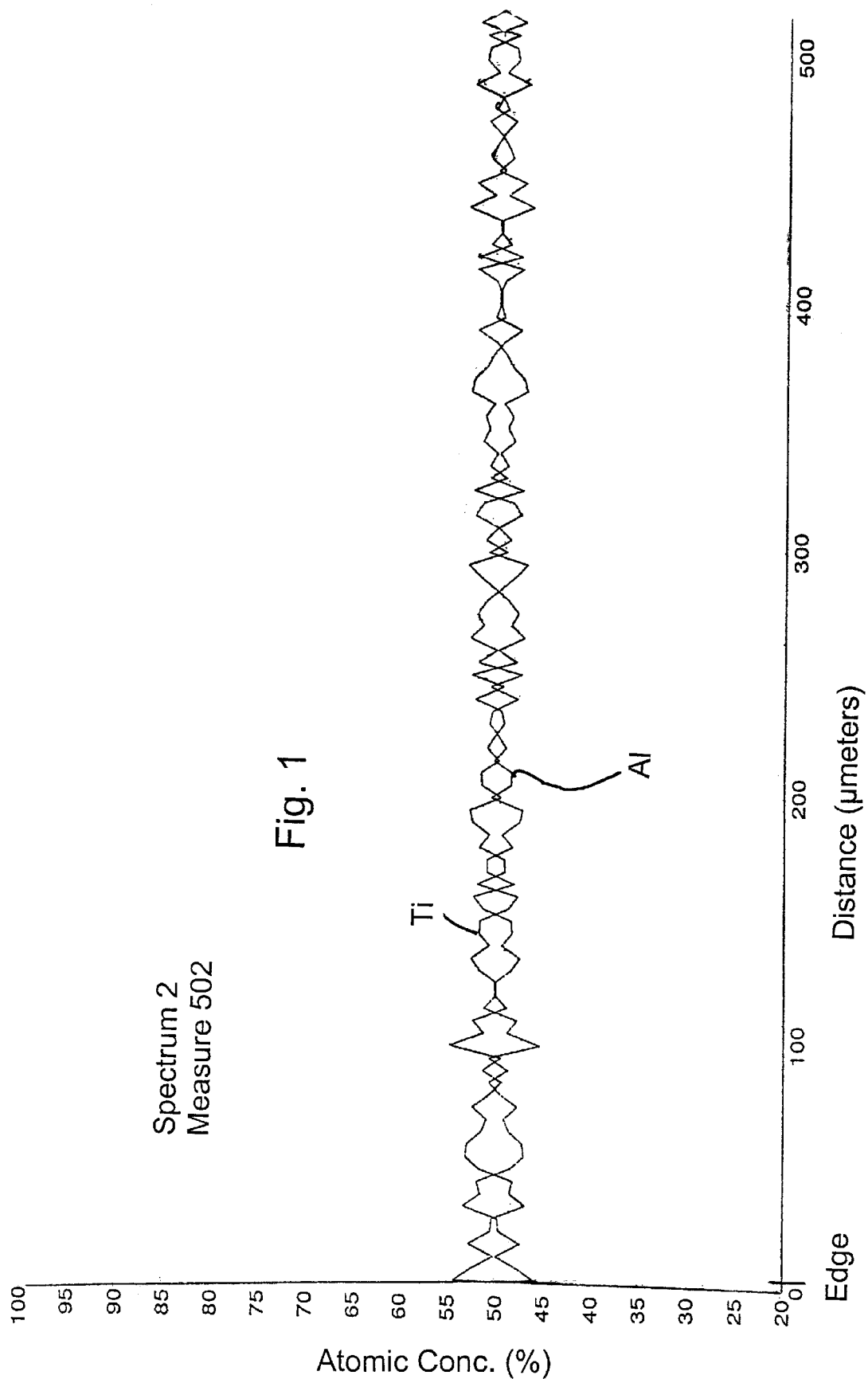
FIG. 1 an Auger line scan diagram, recorded in the active edge region, by example of an indexable insert of type SNGA 120408, at right angles to the active edge. The titanium and aluminum distribution is recognizably uniform, corresponding to an unchanged composition of the hard material layer in the active edge region, FIG. 2 an Auger line scan recorded on the same object as in FIG. 1, however, on which the titanium and aluminum distribution in the active edge region is of changed composition of the material of the hard material layer, FIG. 3 simplified and schematically, a view onto an installation used for the described experiments.

The coatings realized under A show a uniform titanium or aluminum distribution according to the Auger line scan of FIG. 1. It was recorded starting on the edge of an indexable insert of Type SNGA 120408 coated according to A at right angles to the active edge or the polished machining face to a length of 0.5 mm, corresponding to approximately 60 measuring points per scan. The hardness of the layers realized under A was approximately 3000 $HV_{0.05}$.

Figure 2:
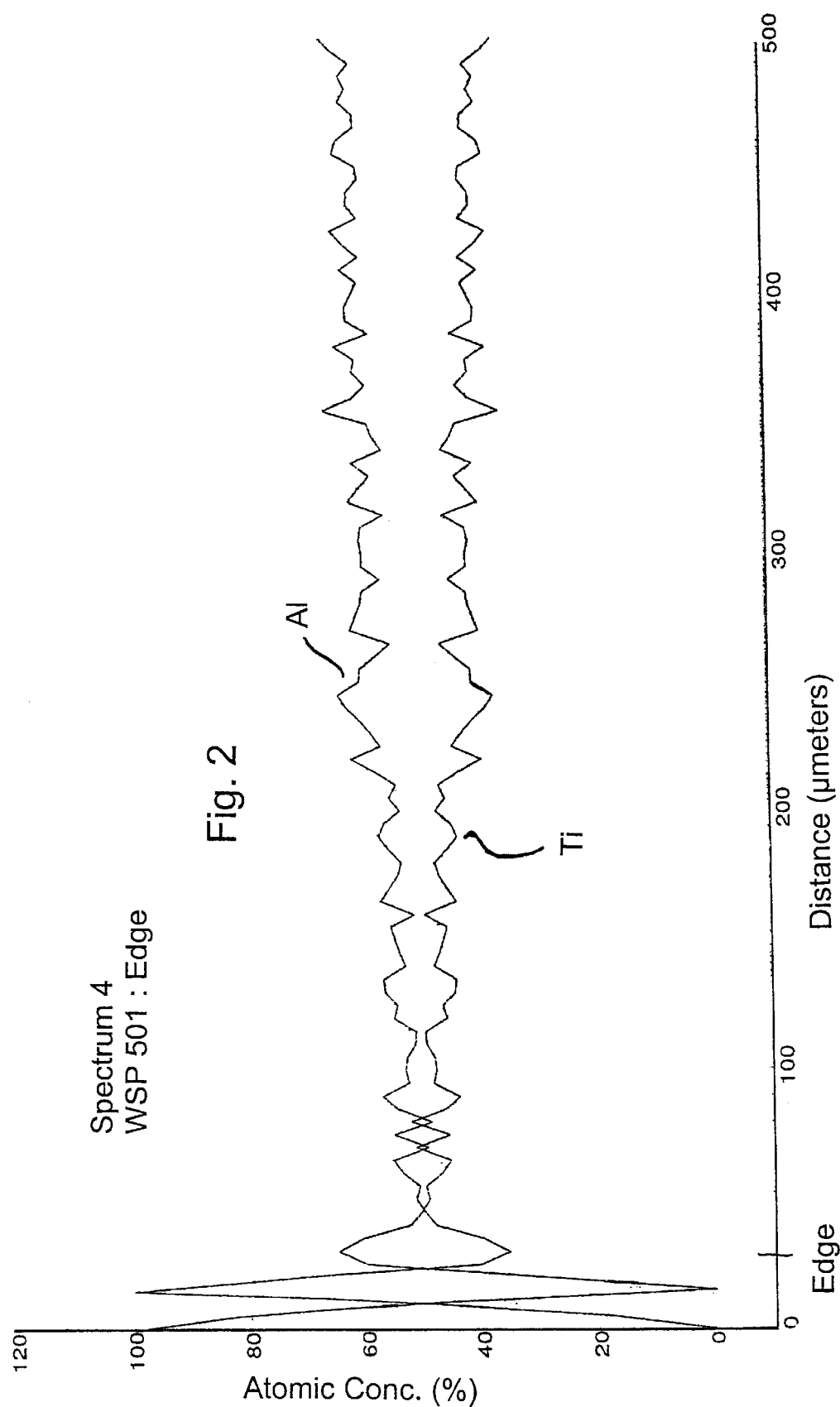

The parameters described under B yield layers which in the active edge region have a strong depletion of the aluminum, namely from 50 at % (on the edge) to 40 at %, or an enrichment of titanium from 50 at % (on the edge) to 60 at %, according to FIG. 2. With more sharply pronounced edges, such as for example in the case of knife cutters, markedly greater differences in the material composition of the hard layer could be measured. The hardness of the layers deposited under B is approximately 3500 $HV_{0.05}$. In the following tables, the two parameter sets A and B for the arc vaporization coating are summarized.

All experiments were carried out on an installation BAJ 1200 under production conditions.

Figure 3:
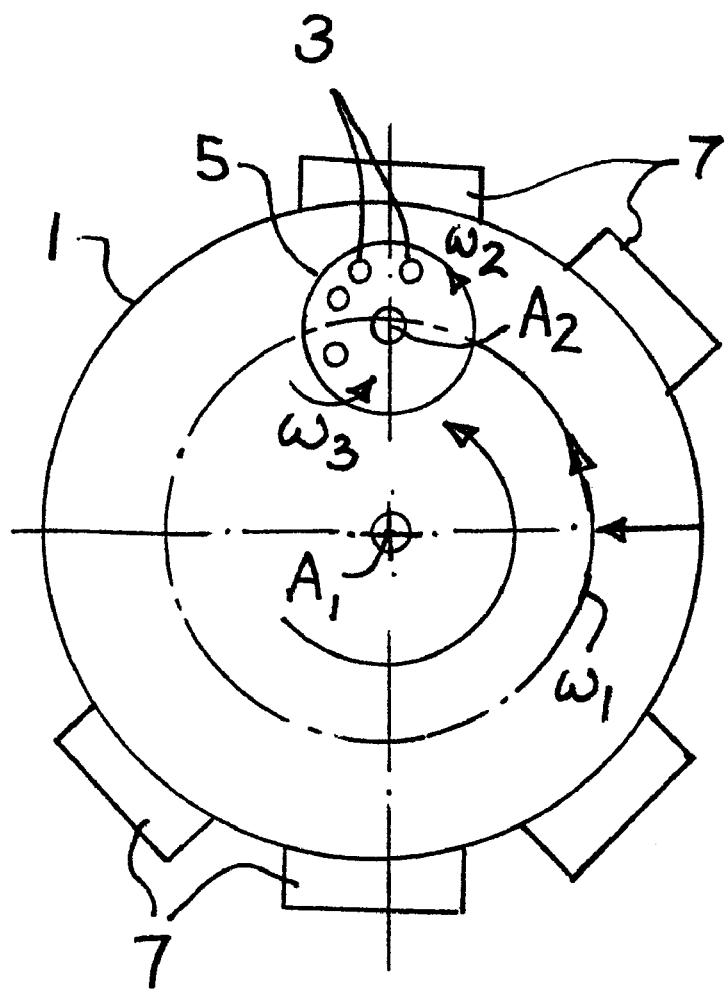

In FIG. 3 the view onto an installation of the given type is shown schematically. In a cylindrical treatment chamber 1 a revolving table is supported rotatably with respect to the central axis $A_1$ as shown with the rotational motion $\omega_1$. On the revolving table several substrate carrier arrangements 3 are supported each rotatable about axes $A_2$, as is shown with the rotational motion $\omega_2$. On the substrate carrier arrangements 3 are supported in individual substrate carriers the substrates 5 grouped about the particular axis $A_2$, which substrates are preferably themselves, and as shown with $\omega_3$ driven about their own axis, set into rotational motion.

Onto the wall of the chamber 1 are flanged one or several arc vaporizer sources 7. With respect to the specific and detailed structure of the installation used, reference is made for example to U.S. Pat. No. 5,709,784 by the same applicant.

In the experiments exclusively $N_2$ gas was used, i.e. as the working gas as well as also the reactive gas. It is understood that additionally also an inert gas, in particular argon, can be used as the working gas. For the coating of type A the total pressure, i.e. the $N_2$ pressure, was approximately $3\times10^{-2}$ mbars, for the experiments B approximately $1\times10^{-2}$ mbars.

Ti, Al was arc-vaporized from alloy targets.

In the following tables denote further:

$p_{N2}$: partial pressure of reactive gas $N_2$
$I_{Ti}$: arc current during titanium vaporization
$I_{TiAl}$: arc current during TiAl alloy vaporization

| Coating Parameters A: | | | |
|---|---|---|---|
| Parameter | | TiN Intermediate Layer | (TiAl)N Hard Material Layer |
| $p_{N2}$ | [mbar] | $8 \times 10^{-3}$ | $3.2 \times 10^{-2}$ |
| $I_{Ti}$ | [A] | 170 | 0 |
| $I_{TiAl}$ | [A] | 0 | 200 |
| $U_{BIAS}$ | [V] | −200 | −40 |

| Coating Parameters B: | | | |
|---|---|---|---|
| Parameter | | TiN Intermediate Layer | (TiAl)N Hard Material Layer |
| $p_{N2}$ | [mbar] | $8 \times 10^{-3}$ | $1 \times 10^{-2}$ |
| $I_{Ti}$ | [A] | 170 | 0 |
| $I_{TiAl}$ | [A] | 0 | 200 |
| $U_{BIAS}$ | [V] | −150 | −150 |

In all cases a TiN intermediate layer was installed between basic tool body and hard material layer.

EXAMPLE 1

Tool: Turning tools with indexable insert K313/CNGP432
Material worked: AISI 304SS≡DIN 1.4306
cutting rate: $v_c$=244 m/min
Advance per rotation: $f_U$=0.2 mm/r
Cutting depth: $a_p$=1.524 mm
Lubricant: emulsion

| Experiment No. | Layer | Working Cycles | Cycle Average |
|---|---|---|---|
| 1 | TiN | 7.5 | 6.8 |
| 2 | | 6.5 | |
| 3 | | 6.5 | |
| 4 | TiAlN "A" | 21.0 | 18.3 |
| 5 | | 17.0 | |
| 6 | | 17.0 | |
| 7 | TiAlN "B" | 6.4 | 5.8 |
| 8 | | 5.5 | |
| 9 | | 5.5 | |

EXAMPLE 2

Tool: Peripheral milling cutters with indexable insert K903/SEHW43A6T

Material worked: AISI 4140≅DIN 1.7225

Cutting rate: $v_c$=1152 m/min

Advance per rotation: $f_t$=0.25 mm/r

Cutting depth: $a_p$=2.54 mm

Lubricant: emulsion

| Experiment No. | Layer | Working Cycles | Cycle Average |
|---|---|---|---|
| 10 | TiN | 15.0 | 14.8 |
| 11 | | 13.0 | |
| 12 | | 15.5 | |
| 13 | | 15.5 | |
| 14 | TiAlN "A" | 37.0 | 24.8 |
| 15 | | 19.0 | |
| 16 | | 21.5 | |
| 17 | | 21.5 | |
| 18 | TiAlN "B" | 13.0 | 12 |
| 19 | | 11.0 | |
| 20 | | 12.0 | |
| 21 | | 12.0 | |

EXAMPLE 3

Tool: HSS drill, 6 mm

Material worked: AISI D3≅DIN 1.2080

Cutting rate: $v_c$=35 m/min

Advance per rotation: $f_U$=0.12 mm/r

Engagement size: $a_e$=3 mm

Drilling depth: h=15 mm, pocket hole

Lubricant: 5% emulsion

| Experiment No. | Layer | Average Number of Holes |
|---|---|---|
| 28 | TiN | 45 |
| 29 | TiCN | 85 |
| 30 | TiAlN "A" | 190 |
| 31 | TiAlN "B" | 30 |

Example 1, 2 and 3 show that for specific tools and conditions of use a composition of the hard material changed in the active edge region, in particular depletion of Al, leads to markedly poorer service lives than an unchanged composition of the hard material layer.

EXAMPLE 4a

Tool: Hard metal roughing shank-type milling cutter, Ø=10 mm, 25/64

Teeth number: z=4

Material worked: DIN 1.2344, 55–56 HRC

Cutting rate: $v_c$=50 m/min

Advance per rotation: $f_t$=0.02 mm/tooth

Engagement size: $a_e$=2 mm

Cutting depth: $a_p$=10 mm

Lubricant: dry, compressed-air cooling

| | | Wear Width in μm after x Operations | | | |
|---|---|---|---|---|---|
| Experiment No. | Layer | x = 10 | x = 20 | x = 30 | x = 35 |
| 22 | TiAlN "A" | 45 | 54 | 65 | 70 |
| 23 | TiAlN "B" | 50 | 69 | 80 | 88 |

This example shows especially hard conditions of use since hard material is worked dry. The tools coated with the parameters A and consequently tools with unchanged composition of the hard material layers in the active edge region show markedly lower wear mark widths than tools with changed composition of the hard material layer in the active edge region.

EXAMPLE 4b

Tool: Hard metal roughing shank-type milling cutter, Ø=10 mm, 25/64

Teeth number: z=3

Machined material: DIN 1.2311, 33 HRC, Rm=1050 N/mm²

Cutting rate: $v_c$=100 m/min

Advance per rotation: $f_t$=0.035 mm/tooth

Engagement size: $a_e$=3 mm

Cutting depth: $a_p$=16 mm

Lubricant: 5% emulsion

| Experiment No. | Layer | Average Length of Path |
|---|---|---|
| 24 | TiN | 24 |
| 25 | TiCN | 27 |
| 26 | TiAlN "A" | 42 |
| 27 | TiAlN "B" | 78 |

This example makes evident that at high cutting rate and additional emulsion lubrication, further with relatively soft material to be worked, on average greater path lengths are achieved with the coating technique according to B.

Consequently, Examples 4a and 4b show that in similar operations but different conditions of use, identical tools coated differently in the active edge region are advantageous in each instance.

In the following Examples 5 to 9 further tools are specified with the particular applicable coating parameters analogous to A and B. Those tools with constant composition of the hard material layer in the active edge region are denoted by $A_0$, analogous tools with changed composition of the hard material layer in the active edge region by $B_0$. Apart from the specified coating parameters, identical basic tool bodies were coated with identical coating processes and compared with one another with respect to their service life.

EXAMPLE 5

Tooling: milling cutter with indexable inserts SEE 42 TN (G9)

Teeth number: z=6

Layer thickness $(Ti_xAl_y)N$: each 4.5 μm

Material worked: SKD 61 (HRC45)

Cutting rate: $v_c$=100 m/min

Advance per tooth: $f_z=0.1$ mm/tooth
Cutting depth: $a_p=2$ mm

| Samples | No. | Coating Conditions Bias [-V] | N2 [$10^{-2}$ mbars] | Arc Current [A] | Al decrease toward edge [at %] | Cutting length [m] |
|---|---|---|---|---|---|---|
| $A_0$ | 32 | 60 | 2.5 | 150 | 1 | 3.2 |
|  | 33 | 60 | 3.2 | 150 | 1 | 3.0 |
|  | 34 | 40 | 2.0 | 150 | 0 | 8.8 |
|  | 35 | 40 | 4.0 | 150 | 0 | 3.9 |
|  | 36 | 40 | 0.5 | 150 | 0 | 2.0 |
|  | 37 | 30 | 2.0 | 150 | 0 | 4.2 |
| $B_0$ | 38 | 100 | 2.0 | 150 | 4 | 1.1 |
|  | 39 | 150 | 3.0 | 150 | 7 | 1.1 |
|  | 40 | 150 | 2.0 | 150 | 4 | 0.5 |

EXAMPLE 6

Tool: HSS drill, Ø 6 mm
Layer thickness $(Ti_xAl_y)N$: each 5 µm
Intermediate TiN layer: each 0.5 µm
Material worked (with emulsion): DIN 1.2080 (AISI D3)
Cutting rate: $v_c=40$ m/min
Advance: f=0.10 mm/r
Drilling depth: 15 mm (pocket hole)

| Samples | No. | Coating Conditions Bias [-V] | N2 [$10^{-2}$ mbars] | Arc Current [A] | Al decrease toward edge [at %] | Number boreholes |
|---|---|---|---|---|---|---|
| $A_0$ | 41 | 40 | 3.0 | 200 | 0 | 198 |
|  | 42 | 40 | 3.0 | 200 | 0 | 231 |
| $B_0$ | 43 | 150 | 1.0 | 200 | 7 | 45 |
|  | 44 | 150 | 1.0 | 200 | 7 | 38 |

EXAMPLE 7

Tool: HSS roughing milling cutter, Ø 12 mm
Number of teeth: z=4
Layer thickness $(Ti_xAl_y)N$: each 4.5 µm
Intermediate TiN layer: each 0.3 µm
Material worked dry: DIN 1.2344 (AISI H13)
Cutting rate: $v_c=120$ m/min
Advance per tooth: $f_z=0.6$ mm/tooth
Cutting depth: $a_p=20$ mm
Engagement size: $a_e=5$ mm

| Samples | No. | Coating Conditions Bias [-V] | N2 [$10^{-2}$ mbars] | Arc Current [A] | Al decrease toward edge [at %] | Cutting length [m] |
|---|---|---|---|---|---|---|
| $A_0$ | 45 | 40 | 2.5 | 200 | 0 | 41 |
| $B_0$ | 46 | 150 | 1.0 | 200 | 7 | 12 |

EXAMPLE 8

Tool: Hard metal drill, Ø 11.8 mm
Layer thickness $(Ti_xAl_y)N$: each 5 µm
Intermediate TiN layer: each 0.5 µm
Material worked (with emulsion): GG 25 (gray cast iron)
Cutting rate: $v_c=110$ m/min
Advance: f=0.4 mm/r
Drilling depth: 35 mm (pocket hole)

| Samples | No. | Coating Conditions Bias [-V] | N2 [$10^{-2}$ mbars] | Arc Current [A] | Al decrease toward edge [at %] | Number boreholes |
|---|---|---|---|---|---|---|
| $A_0$ | 47 | 40 | 3.0 | 200 | 0 | 2840 |
| $B_0$ | 48 | 150 | 1.1 | 200 | 7 | 1270 |

EXAMPLE 9

Tool: Hard metal indexable insert, external turning
Layer thickness $(Ti_xAl_y)N$: each 5 µm
Intermediate TiN layer: each 0.2 µm
Material worked (with lubrication): DIN 1.4306 (X2CrNi 1911)
Cutting rate: $v_c=240$ m/min
Advance per rotation: f=0.6 mm
Cutting depth: $a_p=1.5$ mm

| Samples | No. | Coating Conditions Bias [-V] | N2 [$10^{-2}$ mbars] | Arc Current [A] | Al decrease toward edge [at %] | Cutting length [m] |
|---|---|---|---|---|---|---|
| $A_0$ | 49 | 40 | 3.0 | 200 | 0 | 4.732 |
| $B_0$ | 50 | 150 | 1.0 | 200 | 7 | 2.015 |

The Examples 5 to 9 show the superiority of tools with unchanged hard material layer composition in the active edge region in different spectific applications.

EXAMPLE 10

Tool: Hard metal front-end milling cutter, Ø 10 mm
Tooth number: z=6
Layer Thickness $(Ti_xAl_y)N$: each 3.5 µm
Material worked dry: AISI (DIN 1.2379), 60 HRC
Cutting Rate: $v_c=20$ m/min
Advance per tooth: $f_z=0.035$ mm/tooth
Cutting depth: $a_p=15$ mm
engagement size: $a_e=1$ mm

| Samples | No. | Coating Conditions Bias [-V] | N2 [$10^{-2}$ mbar] | Arc Current [A] | Al decrease toward edge [at %] | Cutting length [m] |
|---|---|---|---|---|---|---|
| $A_0$ | 51 | 40 | 3.0 | 200 | 0 | 4 |
|  | 52 | 40 | 2.0 | 200 | 0 | 2 |
|  | 53 | 20 | 2.0 | 200 | 0 | 3 |
|  | 54 | 70 | 3.0 | 200 | 1.5 | 12 |
| $B_0$ | 55 | 200 | 3.0 | 200 | 9 | 21 |

-continued

| | | Coating Conditions | | | |
|---|---|---|---|---|---|
| Samples | No. | Bias [-V] | N2 [$10^{-2}$ mbar] | Arc Current [A] | Al decrease toward edge [at %] | Cutting length [m] |
| | 56 | 150 | 2.0 | 200 | 7 | 29 |
| | 57 | 100 | 1.0 | 200 | 4 | 17 |
| | 58 | 100 | 2.0 | 200 | 4 | 22 |

EXAMPLE 11

Tool: Hard metal front-end milling cutter, Ø 10 mm
Tooth number: z=6
Layer Thickness ($Ti_xAl_y$)N: each 3.5 µm
Intermediate TiN layer: each 0.1 µm
Material worked DIN 1.2379 (AISI D2), 60 HRC
cutting rate: $v_c$=20 m/min
Advance per tooth: $f_z$=0.03 mm/tooth
Cutting depth: $a_p$=15 mm
Engagement size: $a_e$=1 mm

| | | Coating Conditions | | | | |
|---|---|---|---|---|---|---|
| Samples | No. | Bias [-V] | N2 [$10^{-2}$ mbars] | Arc Current [A] | Al decrease toward edge [at %] | Cutting length [m] |
| $A_0$ | 55 | 40 | 3.5 | 200 | 0 | 22 |
| $B_0$ | 56 | 150 | 1.0 | 200 | 7 | 31 |

EXAMPLE 12

Tool: Hard metal ball-end milling cutter J97 (jabro), R4 (Ø 8×65 mm)
Layer thickness ($Ti_xAl_y$)N: each 3.5 µm
Intermediate TiN layer: each 0.1 µm
Material worked dry: DIN 1.2343, 49.5 HRC
Cutting rate : $v_c$=240 m/min
Cutting depth: $a_p$=0.5 mm

| | | Coating Conditions | | | | |
|---|---|---|---|---|---|---|
| Samples | No. | Bias [-V] | N2 [$10^{-2}$ mbars] | Arc Current [A] | Al decrease toward edge [at %] | Cutting length [m] |
| $A_0$ | 57 | 40 | 3.0 | 200 | 0 | 111 |
| $B_0$ | 58 | 150 | 1.0 | 200 | 7 | 168 |

Examples 10 to 12 show that under certain application conditions and with specific tools the service lives are increased if the composition of the hard metal layer is changed in the active edge region.

What is claimed is:

1. A set of two machining tools for satisfying different service requirements of two different cutting applications, comprising:

a first machining tool comprising a basic body of metal, the basic body having a first active cutting region that contains a first cutting edge and a first surface area that is spaced from the first cutting edge but which is still part of the first active cutting region, a first hard material coating on the first active cutting region, the first hard material coating having a material composition which is constant along all of said first active cutting region, from said first cutting edge to said first surface area, so that said first machining tool is useful for a first application requiring higher adhesive strength of the first hard material coating as compared with the hardness of the first hard material coating; and a second machining tool comprising a basic body of metal, the basic body having a second active cutting region that contains a second cutting edge and a second surface area that is spaced from the second cutting edge but which is still part of the second active cutting region, a second hard material coating on the second active cutting region, the second hard material coating having a material composition which varies along said second active cutting region, from said second cutting edge to said second surface area, so that said second machining tool is useful for a second application requiring higher hardness of the second hard material coating as compared with the adhesive strength of the second hard material coating.

2. The tool set of claim 1, wherein the first machining tool is adapted for use for the first application which is for cutting a large cross sectional area of a workpiece at a low cutting rate, and the second machining tool is adapted for use for the second application which is for cutting a small cross sectional area of a workpiece at a high cutting rate.

3. The tool set of claim 1, wherein the first and the second hard material coatings comprise at least one (Ti,Al)N layer.

4. The tool set of claim 3, wherein a content of Al in the material composition of the first hard material coating varies by less than 1 at % from the first surface area to the first cutting edge of the first active cutting region, and a content of Al in the material composition of the second hard material coating varies by at least 2 at % from the second surface area to the second cutting edge of the second active cutting region.

5. The tool set of claim 1, wherein the first machining tool is selected from the group consisting of: a drill, a roughing milling cutter, a peripheral milling cutter, a hobbing machine or a turning tool, and the second machining tool is selected from the group consisting of: a front-end milling cutter or a ball-end milling cutter.

6. The tool set of claim 1, wherein the first machining tool is adapted for cutting workpiece material having a hardness of up to at most 45 Rockwell and a tensile strength of up to at most 1500 N/mm².

7. The tool set of claim 6, wherein the second machining tool is adapted for cutting workpiece materials having a hardness of more than 45 Rockwell and a tensile strength of more than 1500 N/mm².

8. The tool set of claims 1, wherein the first machining tool is selected from the group consisting of:

an indexable insert for turning tools and for materials AISI 304SS or DIN 1.4306 to be worked;

an indexable insert for peripheral milling cutters for materials AISI 4140 or DIN 1.7225 to be worked;

an indexable insert SEE 42TN for milling cutters for material SKD 61 (HRC 45) to be worked;

a hard metal roughing shank-type milling cutter for materials DIN 1.2344 to be worked in dry working; or an HSS drill for materials AISI D3 or DIN 1.2080 as well as GG 25 to be worked with emulsion lubrication.

9. The tool set of claim 1, wherein the second machining tool is a hard metal roughing shank-type milling cutter for materials DIN 1.2311 to be worked with emulsion lubrication or a hard metal front-end milling cutter for working of AISI D2 or DIN 1.2379 or a hard metal ball-end milling cutter for dry working of DIN 1.2343, 49.5 HRC materials.

* * * * *